(12) United States Patent
Chung et al.

(10) Patent No.: US 7,042,271 B2
(45) Date of Patent: May 9, 2006

(54) RESISTOR COMPENSATION APPARATUS

(75) Inventors: David Kyong-Sik Chung, Irvine, CA (US); Afshin Momtaz, Laguna Hills, CA (US); Mario Caresosa, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 11 days.

(21) Appl. No.: 10/840,524

(22) Filed: May 6, 2004

(65) Prior Publication Data

US 2005/0248382 A1 Nov. 10, 2005

(51) Int. Cl.
*G06F 7/64* (2006.01)
(52) U.S. Cl. ........................................ 327/341
(58) Field of Classification Search ................ 327/341, 327/362, 378

See application file for complete search history.

(56) References Cited

U.S. PATENT DOCUMENTS 6,215,358 B1 * 4/2001 Hon et al. .................. 330/289
6,868,025 B1 * 3/2005 Hsu ........................... 365/211

* cited by examiner

*Primary Examiner*—My-Trang Nu Ton
(74) *Attorney, Agent, or Firm*—Christie, Parker & Hale, LLP

(57) ABSTRACT

A compensation apparatus maintains an effective resistance of one or more resistors in a circuit by associating an adjustable resistor circuit to each resistor. The compensation apparatus compares the resistance of a resistor in the circuit with the resistance of a reference resistor. When the resistance of the resistor in the circuit falls outside of a desired range, the compensation apparatus adjusts the resistance of the adjustable resistor to adjust the effective resistance of the resistor and adjustable resistor combination.

26 Claims, 10 Drawing Sheets

RESISTOR COMPENSATION APPARATUS

FIELD OF THE INVENTION

This application relates to data processing systems and, more specifically, to a compensation apparatus for resistors.

BACKGROUND

Electronic devices are made up of a variety of components including, for example, transistors, resistors, capacitors and inductors. The characteristics of these components may depend on the material used to make them, the physical dimensions of the components and the operating conditions. For example, the resistance of a resistor may depend on the size of the resistor, the composition of materials used to make the resistor and the operating temperature.

During the manufacturing process, variations may occur that result in differences between the intended characteristics of a component and the actual characteristics of the manufactured component. For example, a resistor may be slightly larger or smaller than intended. Similarly, the material from which the resistor was made may not have the precise proportion of each element as was intended.

Variations that result from operating conditions may be somewhat less predictable. For example, depending on where the electronic device is being operated, the components may be subjected to varying degrees of temperature, humidity radiation and other conditions. Moreover, some of these conditions may change at relatively unpredictable rates.

To ensure proper operation of an electronic circuit, the electronic circuits typically are designed in a manner that takes these variations into account. That is, the electronic device may be designed so that it will operate properly even when the characteristics of the components vary.

In cutting edge applications, however, the degree to which a design may tolerate component variations may be limited to relatively small variations. In these applications even very small variations in the characteristics of components may have a relatively large impact on the operating performance of the electronic device. Accordingly, only components having characteristics within a specified range of acceptable values (commonly referred to as being "in specification" or "in spec.") are used in such devices.

In some applications, reliable operation after manufacture is ensured by repetitively testing the electronic circuit. For example, tests may be run to ensure that some or all of the components in an electronic device are operating properly. In some cases, the failure of components may be traced to certain components being out of specification. Alternatively, tests may be run to verify that components are within a specified range of acceptable values. In the event the components are not within specification, the components may be replaced.

In some applications, however, out of specification components may not be easily replaced. For example, integrated circuits incorporate millions of components such as transistors and resistors. When the components in an integrated circuit are not operating within specification, the entire integrated circuit may need to be replaced. This may be a relatively expensive and impractical solution in some applications.

Accordingly, a need exists for improved techniques for making components that maintain a specified range of acceptable values after manufacture and during operation.

SUMMARY

The invention relates to a compensation apparatus for resistors. For convenience, an embodiment of a compensation apparatus constructed according to the invention will be referred to herein simply as an "embodiment."

In some embodiments, the compensation apparatus maintains the resistance of select resistors in a circuit within a desired range of resistance values. Here, the select resistors are implemented using a programmable resistor circuit. The compensation apparatus maintains the resistance of the select resistors within the desired range by determining whether the resistance of one or more resistors in the circuit (hereafter "comparison resistors") is within a defined range. If the resistance of the comparison resistors in the circuit falls outside of the defined range, the compensation apparatus may determine the magnitude (e.g., a range within which the actual resistance falls) and the direction (e.g., high or low) of the variation. The compensation apparatus then adjusts the resistance of the adjustable resistor circuit by an amount that corresponds to the variation in the resistance of the comparison resistors.

In some embodiments, the compensation apparatus compensates for resistance variations in resistors in an integrated circuit. These variations may be the result of, for example, variations in the manufacturing process or environmental conditions.

The compensation apparatus compares the resistance of resistors in the circuit with the resistance of a high precision external reference resistor. Since the reference resistor is located outside of the integrated circuit it may not be subjected to the same process variations as the resistors in the integrated circuit. Moreover, the external reference resistor may not be subjected to the same environmental conditions as the resistors in the integrated circuit. For example, the ambient temperature may not be as high as the internal temperature of the integrated circuit. Accordingly, the reference resistor may provide a known resistance value from which the variations in internal resistances may be determined.

In some embodiments, the resistor compensation apparatus compares signals generated from a resistor network consisting of the internal resistors and the reference resistor to generate control signals that control programmable resistors that incorporate digital to analog converters. For example, when compared signals indicate that the internal resistors have higher resistance than desired, the resistor compensation apparatus generates control signals that select lower resistance values for the programmable resistors. Thus, by using programmable resistors as resistors in select portions of the integrated circuit, the compensation apparatus may maintain desired resistance values in those portions of the integrated circuit that are particularly sensitive to variations in resistance.

For example, in some applications the compensation apparatus compensates for variations in the value of load resistors in high speed current mode logic ("CML") circuits. In this case, the load resistors are implemented using a programmable resistor circuit. The compensation circuit may then maintain the resistance of these programmable load resistors within a desired range.

In a high speed CML circuit minimal capacitance at the output node of the circuit is an important design criterion. Accordingly, the node of the programmable resistor having the lowest capacitance is, in general, connected to (or closest to) the output node of the CML circuit.

In some embodiments, the compensation apparatus includes a hysteresis circuit that prevents oscillation in the control signals generated by the compensation apparatus. Absent hysteresis, these control signals may oscillate in response to, for example, relatively small changes in temperature in the circuit.

In some applications, the compensation apparatus is used to provide resistor compensation in applications such as an integrated receiver that is relatively sensitive to variations in component characteristics caused by process or environmental variations. For example, in an integrated decision feedback equalizer and clock and data recovery circuit the values of load resistors in the flip-flops and/or latches that are used in retiming operations may be critical. This is because variations in the values of these resistors may cause variations in, for example, the delay of the feedback loop of the decision feedback equalizer. Variations in this delay may adversely affect the ability of the clock and data recovery circuit to accurately recover data from a received signal. This adverse effect may be particularly significant in high speed applications such as Ethernet receivers that operate at 10 Gigabits per second ("Gbit").

BRIEF DESCRIPTION OF THE DRAWINGS

These and other features, aspects and advantages of the present invention will be more fully understood when considered with respect to the following detailed description, appended claims and accompanying drawings, wherein:

Figure 1:
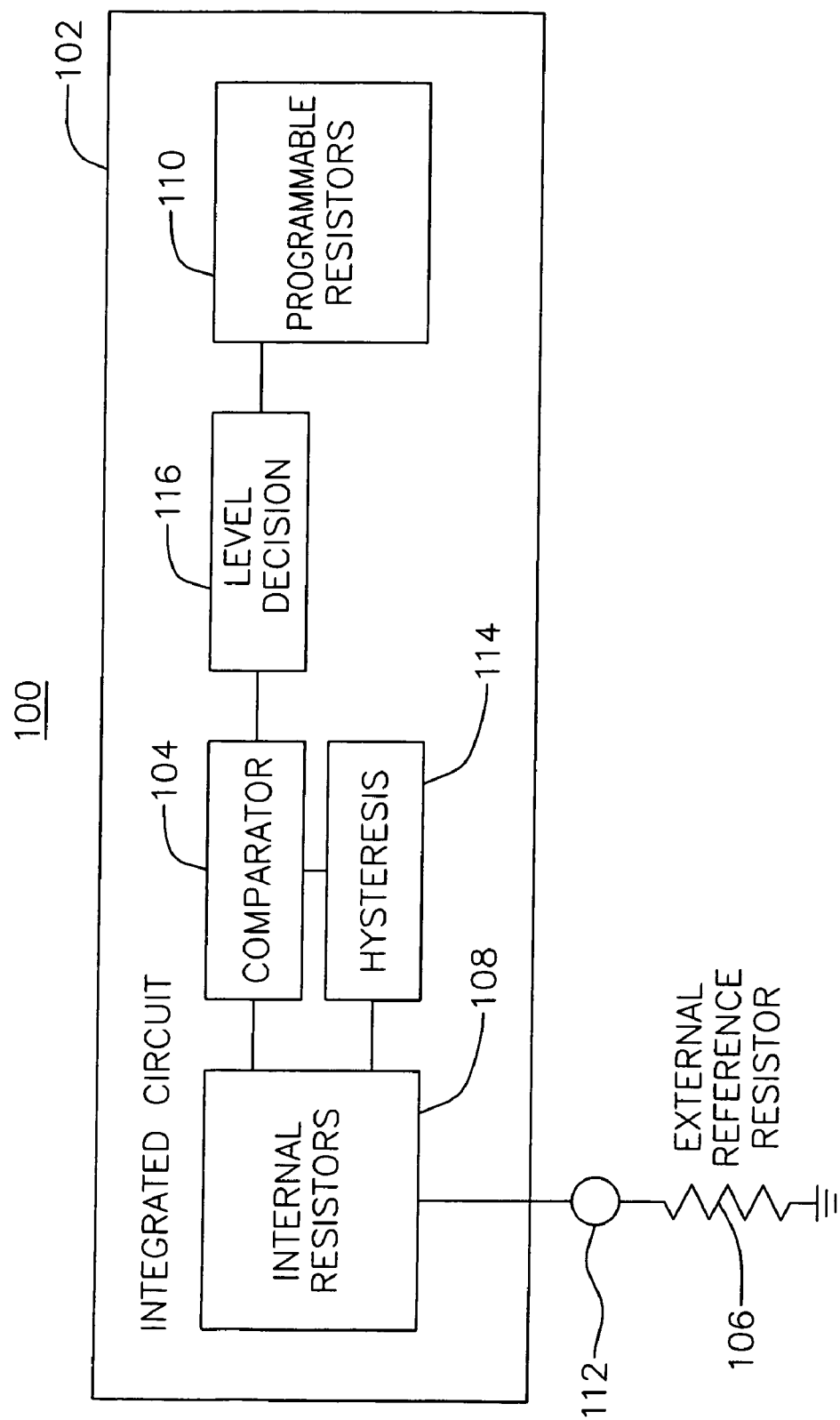
FIG. 1 is a simplified block diagram of one embodiment of a resistor compensation apparatus constructed in accordance with the invention.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals denote like features throughout the specification and figures.

DETAILED DESCRIPTION

The invention is described below, with reference to detailed illustrative embodiments. It will be apparent that the invention may be embodied in a wide variety of forms, some of which may be quite different from those of the disclosed embodiments. Consequently, the specific structural and functional details disclosed herein are merely representative and do not limit the scope of the invention.

FIG. 1 is a block diagram of one embodiment of a resistor compensation apparatus 100 constructed according to the invention. In this embodiment, the resistor compensation apparatus 100 is incorporated, in part, into an integrated circuit 102. Due to process variations and environmental conditions the resistance of internal resistors in the integrated circuit 102 may vary by, for example, ±10%.

In some applications, this amount of variance is undesirable. For example, in high speed applications such as a 10 Gbit receiver the timing margins are relatively small. Here, a ±10% variation in resistance may adversely affect the bandwidth and/or the delay in the circuit components that are in the high speed data path. In conventional applications, a more complicated circuit may be implemented to account for such variation. However, in some cases, the resulting circuit may be impractical for commercial applications.

To overcome such problems, the embodiment of FIG. 1 incorporates circuitry that maintains the resistance of programmable resistors 110 in the integrated circuit 102 within a desired range. The programmable resistors 110 are used, for example, in critical (e.g., high speed) portions of the integrated circuit 102 that are particularly sensitive to variations in resistance. Thus, in an apparatus constructed according to the invention it may not be necessary to significantly change the circuit design to account for variations in resistance as in conventional applications.

The resistor compensation apparatus 100 changes the resistance of the programmable resistors 110 based on a determination of whether the resistance of internal resistors 108 in the integrated circuit is within a desired range. To determine whether the resistance is within the desired range the resistor compensation apparatus 100 compares the resistance of the internal resistors 108 with the resistance of an external reference resistor 106.

Since the external reference resistor 106 is located outside of the integrated circuit, it may not be subjected to the same process variations and environmental conditions as the internal resistors 108. Moreover, the reference resistor may be a very precise resistor. For example, the resistance of the reference resistor may have a tolerance of ±1%. Typically, the external reference resistor 106 is connected to the integrated circuit 102 via an external pad 112.

To accomplish the above mentioned resistance comparison, the resistor compensation apparatus 100 includes one or more comparators (hereafter referred to for convenience as "comparator 104"). The comparator 104 compares signals from a resistor network consisting the internal resistors 108 and the external reference resistor 106 and, based on this comparison, generates signals indicative of whether the resistance of the internal resistors 108 is within the desired tolerance.

If the resistance is not within tolerance the resistor compensation apparatus 100 generates control signals that change the values of the programmable resistors 110. In some embodiments, the signals generated by the comparator 104 are processed by a level decision circuit 116 which then generates signals that control the programmable resistors 110. The level decision circuit 116 may be used to resolve relative ambiguities in the level of the control signals. Such ambiguities may occur, for example, when two signals that are being compared are relatively close in value. In this case, the comparator 104 may not consistently indicate that the value of one of the signals is higher than the value of the other signal.

In some embodiments, the resistor compensation apparatus 100 includes a hysteresis circuit 114 that may prevent the output of the comparator 104 from oscillating under certain conditions. For example, the hysteresis circuit 114 may adjust the levels of signals input to the comparator 104 to prevent these levels from being too close in magnitude with respect to one another. In this way, the comparator 104 will be less sensitive to input signal variations that may occur as a result of, for example, changes in temperature.

In a typical embodiment the circuit 100 may be used to provide compensation for internal resistors having resistance variation of ±20% or more by using an external high precision resistor having resistance variation on the order of ±1%.

Figure 2:
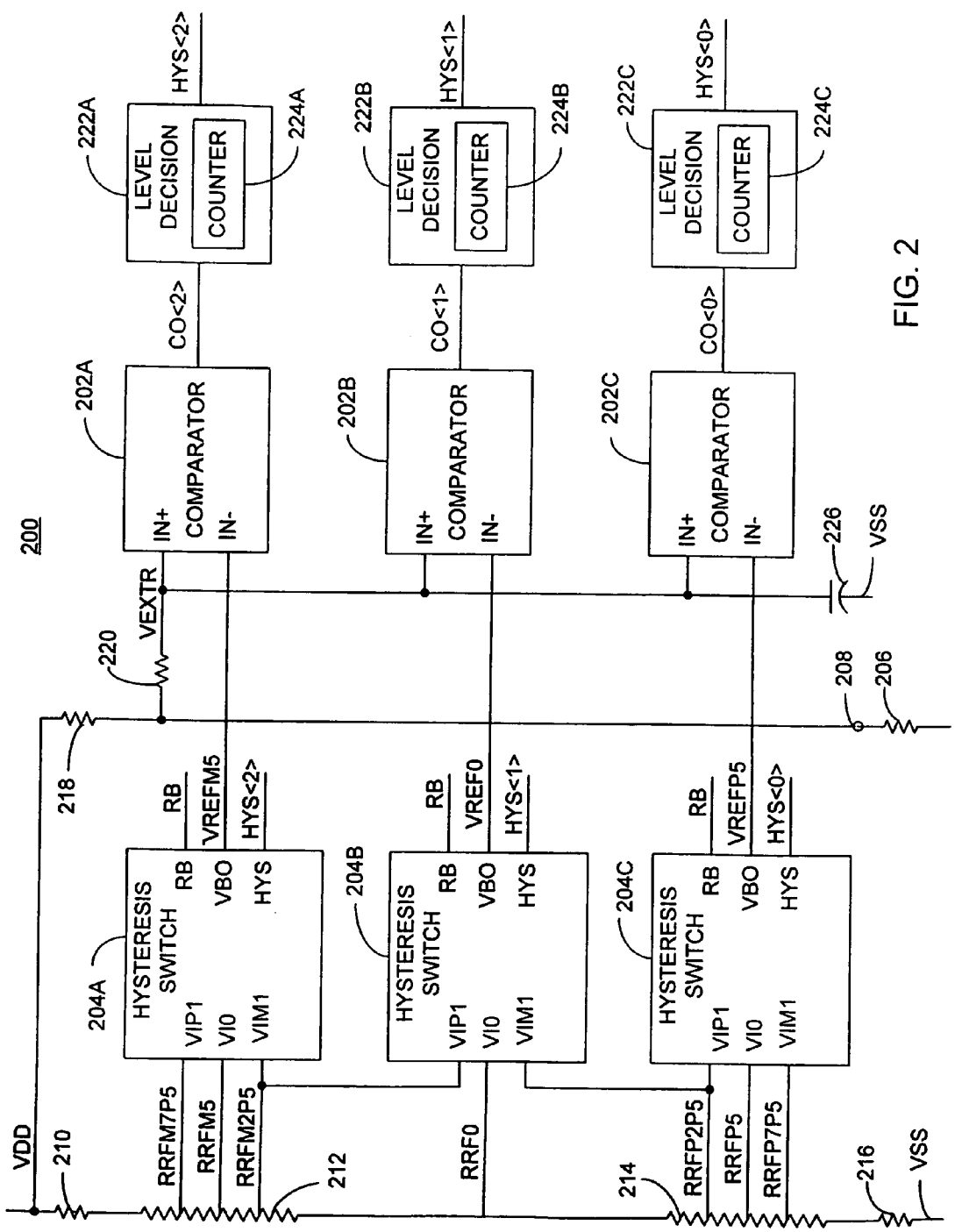
FIG. 2 is a simplified block diagram of one embodiment of a resistor compensation apparatus constructed in accordance with the invention.
Figure 3:
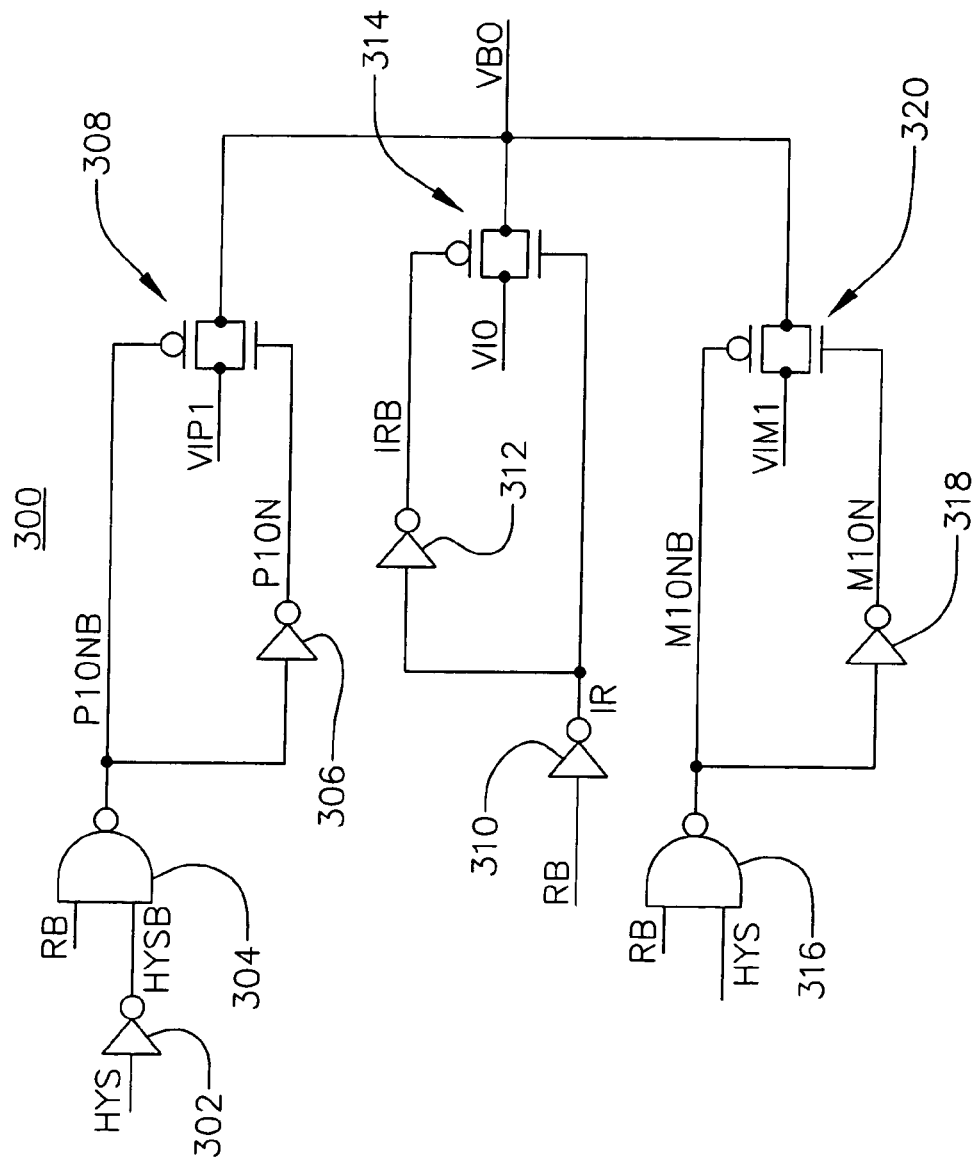
FIG. 3 is a simplified block diagram of one embodiment of a hysteresis switch for a resistor compensation circuit constructed in accordance with the invention.
Figure 4:
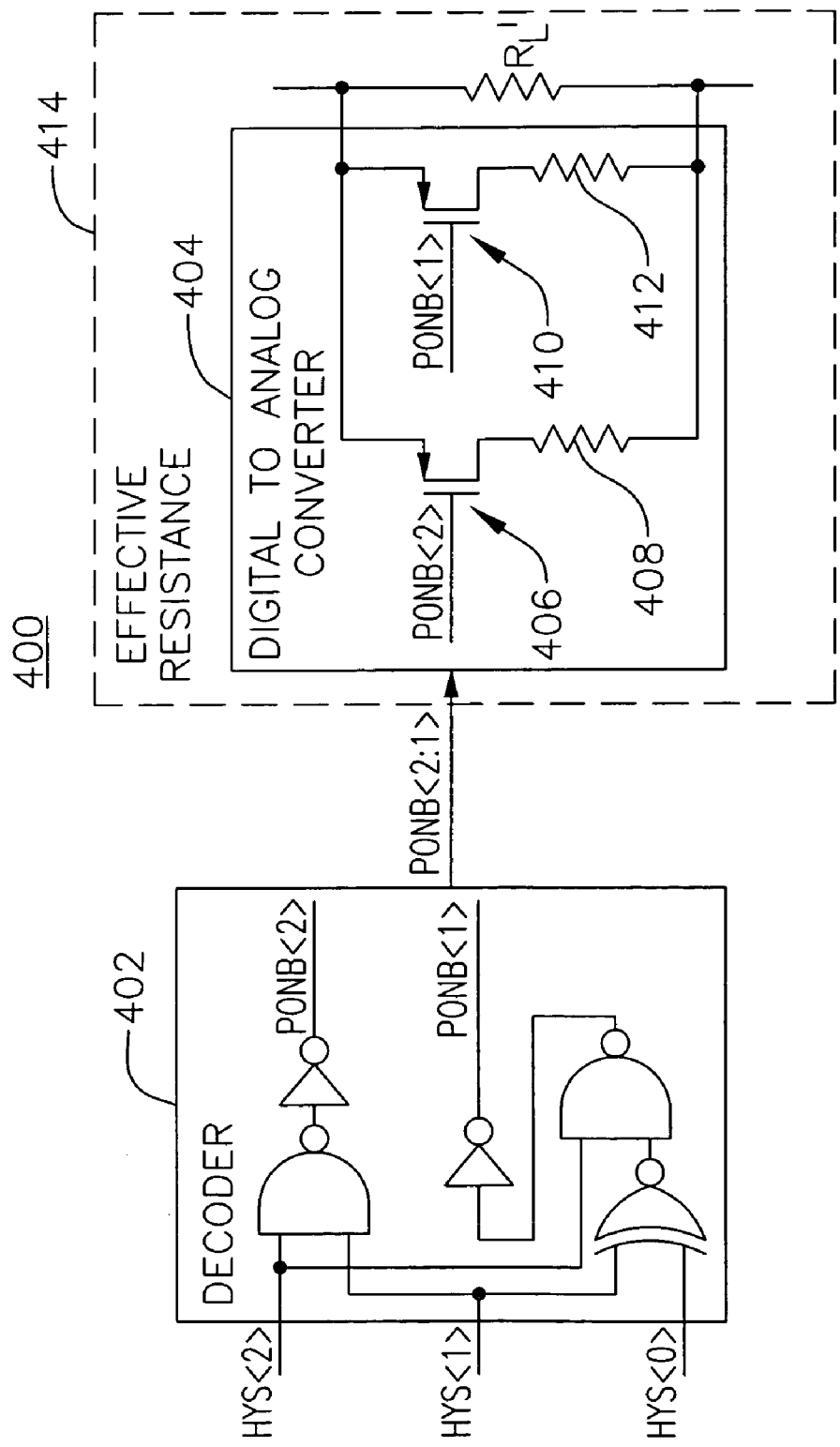
FIG. 4 is a simplified block diagram of one embodiment of a decoder and a digital to analog converter for a resistor compensation circuit constructed in accordance with the invention.
Figure 5:
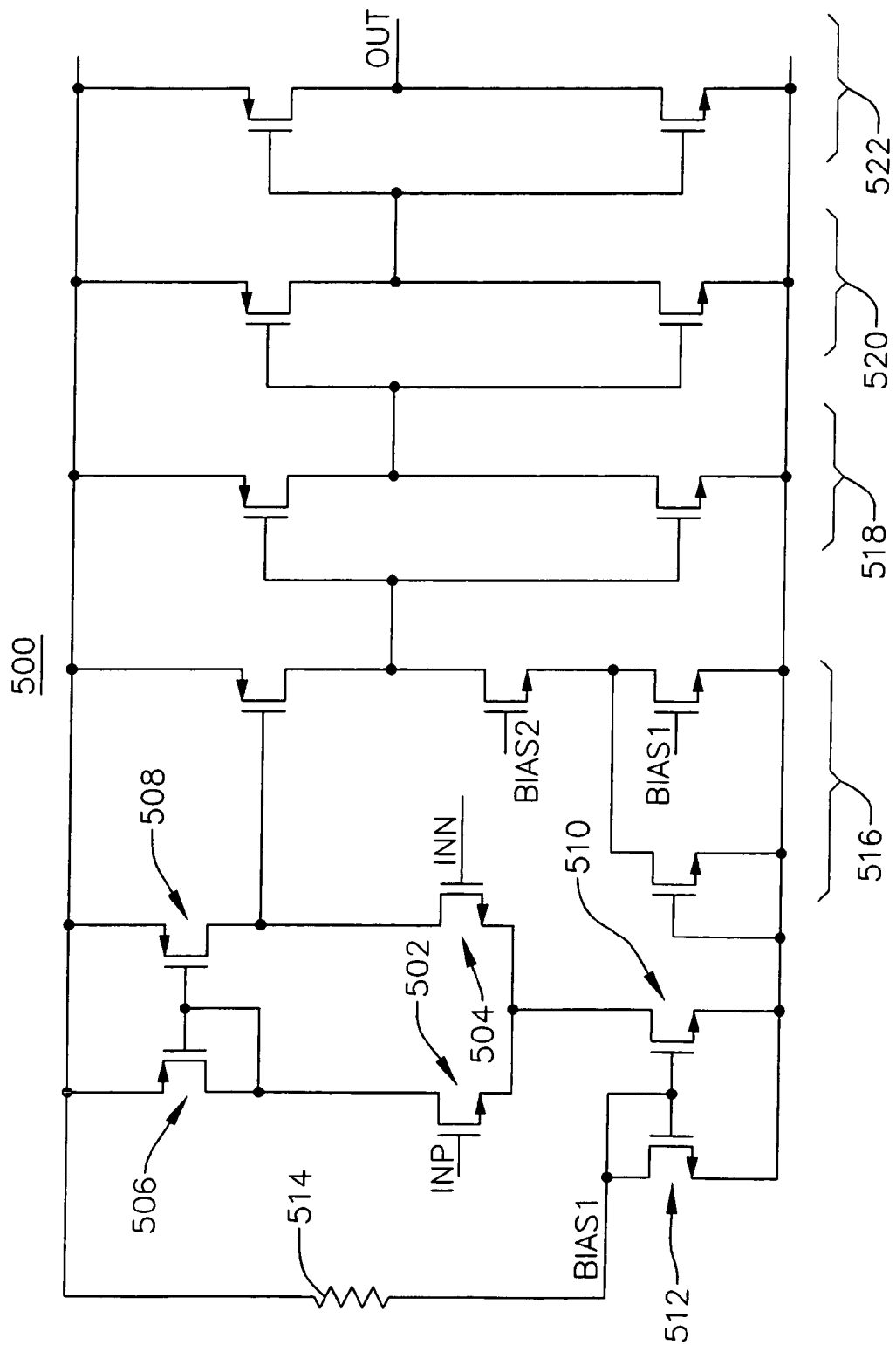
FIG. 5 is a simplified block diagram of one embodiment of a comparator for a resistor compensation circuit constructed in accordance with the invention.

FIGS. 2–5 are block diagrams of one embodiment of a resistor compensation circuit. FIG. 2 depicts one embodiment of a circuit 200 that generates control signals HYS<2:0> indicative of whether the resistance of an internal resistor is within one of several defined ranges. FIG. 3 depicts one embodiment of a hysteresis switch 300 that may be used in the circuit 200. FIG. 4 depicts one embodiment of a decoder 402 that decodes the control signals HYS<2:0> into control signals PONB<2:1> that control a programmable resistor comprising a digital to analog converter 404 and a resistor $R_L'$. FIG. 5 depicts one embodiment of a comparator 500 that may be used in the circuit 200.

Referring to FIG. 2, the circuit 200 generates the control signals HYS<2:0> by comparing a resistance value of an internal resistor 218 with a resistance value of a precise external resistor 206. Specifically, comparators 202A–C compare the signal VEXTR generated by the voltage divider defined by resistors 218 and 206 with reference signals VREFM5, VREF0 and VREFP5 generated by hysteresis switches 204A–C, respectively.

Each hysteresis switch outputs one of the inputs VIP1, VI0 or VIM1 on the VBO output. This selection is based on the states of inputs RB and HYS. The signals at the inputs VIP1, VI0 or VIM1 for each hysteresis switch are provided by a resistor ladder comprising resistors 210, 212, 214 and 216.

The higher taps on the resistor ladder provide higher signal levels than the lower taps on the resistor ladder. For example, the level of signal RRFP5 is higher than the level of RRFP7P5. As will be discussed in more detail in conjunction with FIG. 3, the level of signal VREFM5 will be greater than the level of signal VREF0 and the level of signal VREF0 will be greater than the level of signal VREFP5. Accordingly, each of the comparators 202A–C will compare the signal VEXTR with a different signal level.

Since the external resistor 206 is a very precise resistor, any variation in the value of signal VEXTR will primarily result from a variation in the value of resistor 218. In some embodiments, the nominal value for resistor 218 is selected to be the same as the nominal resistance of resistor 206 (e.g., 4.75K). Thus, assuming the two resistors are at their nominal values, the value of VEXTR will be one half of the difference between the power supply signals VDD and VSS. If, due to process variations or other factors, the value of resistor 218 is some other value, the value of VEXTR will change accordingly.

In general, the resistor 220 does not affect the signal VEXTR in any significant way because negligible current flows through resistor 220. This is a result of the comparators being CMOS circuits that have very high input impedance. The resistor 220 provides electrostatic discharge protection for the integrated circuit. This protection is provided here because otherwise the input of the comparators 202A–C may be connected directly to an external pad 208. A capacitor 226 in series with the resistor 220 provides noise filtering.

Through appropriate selection of the values of the resistors 206, 218 and the resistor ladder and the operation of the hysteresis switches 204A–C, the circuit 200 may be designed to generate control signals that indicate a variation of the resistor 218 from its nominal value. As an example, the resistor ladder may be designed such that resistors 210 and 216 have an equal resistance and resistors 212 and 214 have an equal resistance. In addition, the resistance of resistor 210 is nineteen times the resistance of resistor 212. Moreover, the resistance across resistor 212 is divided into fourths by the taps. Resistor 214 is constructed in the same manner as resistor 212. With resistors 206 and 218 being designed with identical nominal values, the outputs CO<2:0> of the comparators 202A–C may be represented by Table 1 in an embodiment where control is desired over four ranges of resistance variation.

TABLE 1

| REGION | APPROXIMATE VARIATION | CO<2:0> | PONB<2:1> |
|---|---|---|---|
| 0 | −10% - −5% | 1 1 1 | 1 1 |
| 1 | −5% - 0% | 0 1 1 | 1 0 |
| 2 | 0% - +5% | 0 0 1 | 0 1 |
| 3 | +5% - +10% | 0 0 0 | 0 0 |

Table 1 shows that the output signals CO<2:0> may provide an indication of variations in resistance of approximately 5% for the resistor 218. FIG. 4 illustrates one embodiment of a decoder 402 that may be used to decode the output signals CO<2:0> to provide two control signals PONB<2:1> for embodiments where control is desired over only four ranges. In this case, the two control signals PONB<2:1> control a programmable resistor comprising the digital to analog converter 404 and the resistor $R_L'$. Thus, the effective resistance 414 of the programmable resistor may be set to one of four values. Typically, for a given resistor variance within one of these four ranges, the programmable resistor will be adjusted to a value in the middle of the range.

As described, the embodiment of FIG. 2 may maintain the resistance of one or more programmable resistors in the integrated circuit to be within a desired range of approximately ±2.5% even when the resistances of the internal resistors vary by ±10%. In the embodiment of FIG. 2, variations beyond 10% are not compensated further. It should be appreciated, however, that the circuit 200 may be modified to provide compensation for different tolerances of the internals resistors and to provide other desired ranges of resistance.

In some embodiments, level decision circuits 222A–C may process the signals CO<2:0> to provide steadier output signals HYS<2:0> when the inputs (IN+ and IN−) of any of the comparators 202A–C are relatively close in value. When these input signals are relatively close the output of the comparator may toggle between high and low values. In some embodiments, the level decision circuit (e.g., circuit 222A) may sample the input signal (e.g., CO<2>) and increment a counter (e.g., counter 224A) based on the level of the input signal (e.g., CO<2>). For example, the counter 224A may sample for 32 cycles. If at the end of the 32 cycles the counter value is less than 16, the level decision circuit may output a low value indicating that the signal CO<2> is low more often than it is high. Alternatively, if the counter value is 16 or greater, the level decision circuit may output a high value. As illustrated in FIG. 4, the signals HYS<2:0> may drive the decoder circuit 402 that provides controls signals to the programmable resistors.

The outputs HYS<2:0> of the level decision circuits 222A–C also are provided to the hysteresis switches 204A–C, respectively. Because the programmable resistor provides incremental values of resistance, hysteresis is used to eliminate unwanted transitions between each resistance value. Thus, hysteresis is added to the internal resistor ratios so that once a programmable resistor setting is selected, it is not changed during operation due to, for example, relatively small temperature induced resistor variation. The operation of the hysteresis circuits will be described in more detail in conjunction with FIG. 3.

FIG. 3 depicts one embodiment of a hysteresis circuit 300. The circuit 300 includes three transfer gates 308, 314 and 320 that select, based on the signals RB and HYS, one of three input signals VIP1, VI0 and VIM1 as the signal that is output as signal VBO.

During reset hysteresis is disabled in the circuit 200. The reset state is entered when a reset signal RB is set low. In this case, the transfer gates 308 and 320 will be turned off and the transfer gate 314 will be turned on due to the operation of the inverters 302, 306, 310, 312 and 318 and the NAND gates 304 and 316. As a result, the input signal VI0 will be output as signal VBO regardless of the state of the HYS signal.

Referring to FIG. 2 and Table 2 below it may be seen that during reset the center input signals RRFM5, RRF0 and RRFP5 will be output by the hysteresis switches 204A–C as signals VREFM5, VREF0 and VREFP5, respectively. The signals VREFM5, VREF0 and VREFP5 are fed to the comparators 202A–C and the outputs CO<2:0> of the comparators 202A–C are fed to the level decision circuits 222A–C. After the level decision circuit 222A–C progresses through a complete cycle the signals HYS<2:0> are fed back to the HYS inputs of the hysteresis switches 204A–C. After this point in time the reset signal RB may be de-asserted.

When the RB signal is high, either VIP1 or VIM 1 will be output as VBO, depending on the state of the HYS signal. Specifically, when HYS is low, transfer gate 308 will be on and transfer gates 314 and 320 will be off. As a result, VIP1 will be output as VBO. Conversely, when HYS is high, VIM1 will be output as VBO.

Table 2 also describes the output VBO of the hysteresis switches 204A–C during these non-reset states.

TABLE 2

| HYS<X> | RB | VREF0 | VREFM5 | VREFP5 |
|--------|----|-------|--------|--------|
| X | 0 | RRF0 | RRFM5 | RRFP5 |
| 0 | 1 | RRFM2P5 | RRFM7P5 | RRFP2P5 |
| 1 | 1 | RRFP2P5 | RRFM2P5 | RRFP7P5 |

The hysteresis in FIG. 2 may be correlated with the regions defined in Table 1. For example, assuming the resistance of resistor 218 is equal to the nominal value, after reset the value of CO<2:0> will be "011." In this example, the input signals for comparator 202B will be approximately equal. In this case, the output of comparator 202B may oscillate in the absence of hysteresis when, for example, noise is present on these inputs or the integrated circuit is subjected to variations in temperature. When the value "011" is fed back to the hysteresis switches on signals HYS<2:0> the hysteresis switch 204B will select RRFM2P5 as the new reference signal for comparator 202B. As a result, a larger voltage difference will be present across the inputs of the comparator 202B. Hence, a larger change in the input signals (e.g., greater than that produced by noise) will be required to change the output of the comparator 202B. Similarly, the hysteresis switch 204A will select RRFM7P5 as the new reference signal for comparator 202A. As a result, a larger voltage difference will be present across the inputs of the comparator 202A. From the above, it may be seen that the hysteresis increases the voltage difference across the comparators in response to changes that occur at the transitions of the regions specified in Table 1.

Referring again to FIG. 4, the operation of the programmable resistor will be discussed in more detail. The signals PONB<2> and PONB<1> control transistors 406 and 410, respectively, in the digital to analog converter 404. Depending on the state of these signals the resistors 408 and 412 may selectively be connected in parallel with the resistor $R_L'$. Thus, the value of the effective resistance 414 may be approximately equal to the resistance of 1) $R_L'$; 2) $R_L'$ in parallel with resistor 412; 3) $R_L'$ in parallel with resistor 408; or 4) $R_L'$ in parallel with resistors 408 and 412.

The values selected for the resistors $R_L'$, 408 and 412 depend on the degree of compensation that is desired for each of the four programmable resistor settings. Since this circuit provides an effective resistance 414 of $R_L'$ or less, $R_L'$ is selected to be higher than the desired value of the effective resistance 414. For example, $R_L'$ may be selected to be at the upper range of the tolerance values (e.g., closer to the +10% end of the range). In this way, in the event the fabrication process produces $R_L'$ with a resistance at the bottom end of the tolerance range, the effective resistance of the circuit may still be within the desired range.

In one embodiment, the resistor $R_L'$ is set to compensate for –7.5% of the desired value (resistor $R_L'$=the desired resistance÷0.925). Thus, when the resistance variation falls within –10%––5% the resultant resistance value may be ±2.5% of the desired value.

The resistor 412 and transistor 410 are sized such that when transistor 410 is on, the parallel combination of resistors $R_L'$ and 412 may provide a –2.5% compensated resistance of the desired value (the desired resistance÷0.975). Then, the resistance of resistor 412 and Ron (resistance of a transistor when turned on) of transistor 410 are defined to be equal to "20* the desired resistance."

The resistor 408 and transistor 406 are sized such that when transistor 406 is on, the parallel combination of resistors $R_L'$ and 408 may provide a +2.5% compensated resistance of the desired value (the desired resistance÷1.025). Then the resistance of resistor 408 and Ron of transistor 406 are defined to be equal to "10* the desired resistance." When transistors 406 and 410 are both turned on, the equivalent resistance of the circuit will produce +7.5% compensated resistance of the desired value (desired resistance÷1.075).

In one embodiment the values for the resistors $R_L'$, 408 and 412 are 50.5, 402 and 774 ohms, respectively.

In practice, the effective resistance may not be in the middle of each range. Due to process variation, the Ron of transistors 406 and 410 may not track the variation of resistors 408 and 412. This mismatch may increase the tolerance of desired variation from ±2.5%. Thus, Ron of the transistors 406 and 410 should be much smaller than the resistance of resistors 408 and 412.

Ron also may be sensitive to the voltage at the node defined by the top of the transistors 406 and 410. Accordingly, it may be desirable to operate this node as close to VDD as possible to reduce variation in the circuit. In embodiments that incorporate NMOS switches instead of PMOS switches, it may be desirable to operate a corresponding node of each NMOS switch as close to VSS as possible.

Also, parasitic capacitance in the circuit may be reduced, for example, by reducing the size of the transistors 406 and 410 and by tying the bodies of transistors to VDD. Minimizing this parasitic capacitance is not necessary if the MOS switch end of the resistor is directly connected to VDD. When the programmable resistor is used in series with shunt peaking inductors (FIG. 6), large parasitic capacitance will adversely affect CML performance since $R_L'$ is typically small, e.g., approximately 50Ω.

Hence the MOS transistor size should be reduced to minimize parasitic capacitance. However, this increases Ron and creates larger undesired resistance. These contending parameters should be optimized to maximize performance.

The accuracy of the circuit also may depend on the precision of the ranges in the actual circuit. The performance of the comparators also may have an effect on the accuracy of the range boundaries. Also, a slight error may be attributable to the resistor 220 (FIG. 2) in the event comparator input leakage current creates a noticeable voltage drop across resistor 220.

The parasitic resistance and the physical limitation of the resistor ladder also may cause range boundary error. In some embodiments, these effects may be reduced by using the resistor network described in FIG. 7. To improve accuracy, relatively large resistors are generally desired. Such large resistors may, however, occupy relatively large areas and may be difficult to match.

The parallel resistor–based digital to analog converter 404 may provide a programmable resistor with reduced parasitic effect on the switching elements in the circuit (e.g., Ron and capacitance). As an example, the programmable resistor of FIG. 4 may be used in a current mode logic circuit as depicted in FIG. 6.

Figure 6:
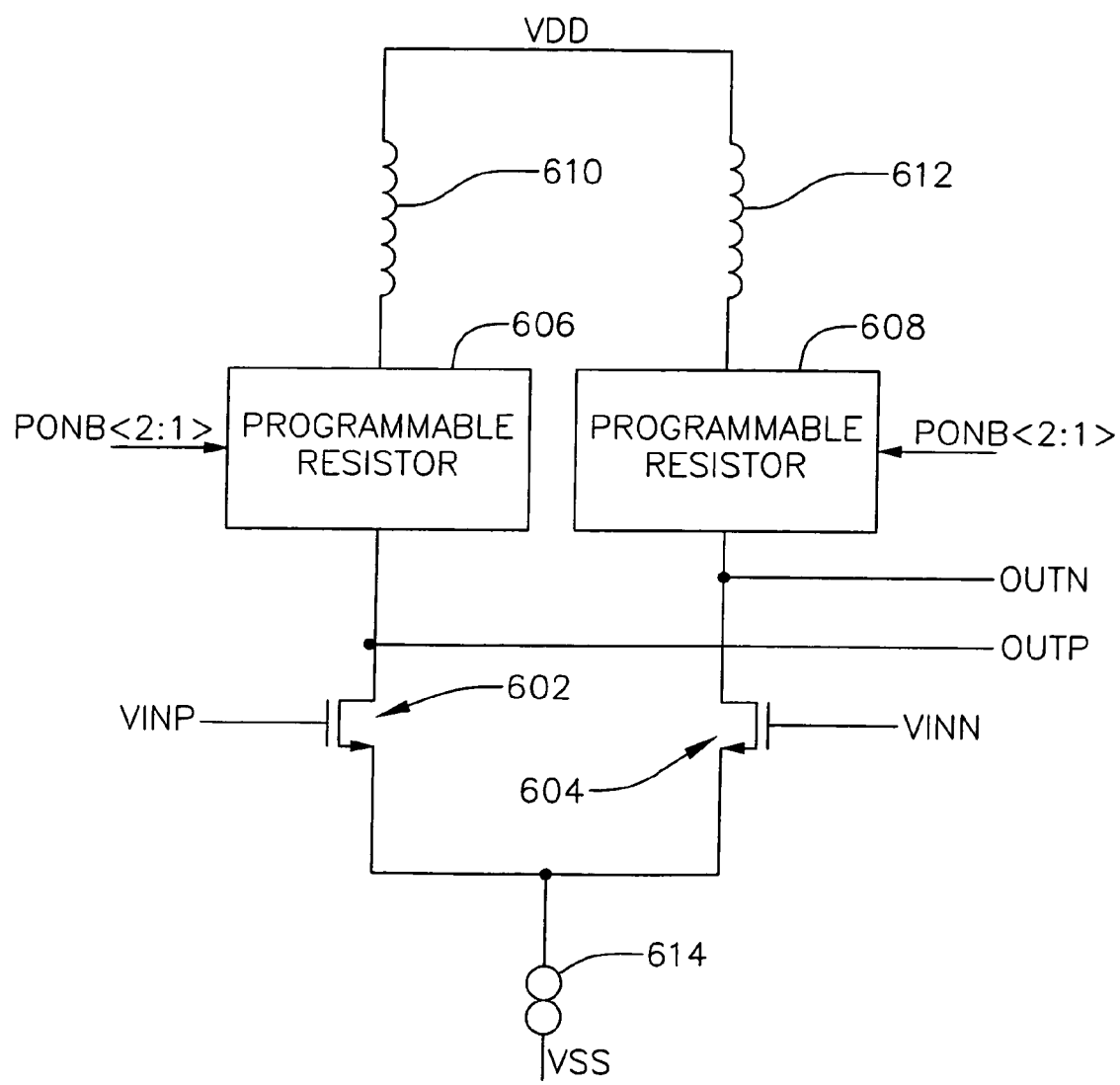
FIG. 6 is a simplified block diagram of one embodiment of a current mode logic circuit incorporating a programmable resistor constructed in accordance with the invention.

FIG. 6 is a simplified block diagram of one embodiment of a current mode logic circuit 600 incorporating programmable resistors 606 and 608. Typical current mode logic is comprised of a current source 614, a differential transistor pair 602 and 604, resistive loads 606 and 608 and, in some embodiments shunt peaking inductors 610 and 612. Due to fabrication process variation, the characteristics of these components may vary such that performance of the circuit is less than optimal. Accordingly, the use of programmable resistors 606 and 608 for the resistive loads provides compensation that may improve the performance of the circuit, particularly at high frequencies such as those prevalent in 10 Gbit receivers.

When the programmable resistor of FIG. 4 is used in a current mode logic circuit as depicted in FIG. 6, the switches (e.g., transistors 406 and 410) are in series with relatively high impedance resistors 408 and 412 and are positioned away from the capacitive sensitive output nodes OUTN and OUTP of the differential pair transistor 602 and 604. For relatively high speed applications where shunt peaking current mode logic buffers are used, the use of the resistor digital to analog converter 404 may provide improved performance due to the relative insensitivity of the shunt peaked buffer to capacitance at the junctions between the inductors 610 and 612 and the programmable resistors 606 and 608. When the switch portion of the resistor digital to analog converter 404 is placed between an inductor (e.g., inductor 610) and a resistor (e.g., programmable resistor 606), the parasitic capacitance of these components may not significantly degrade the high speed performance of the buffer. Accordingly, the digital to analog converter 404 may advantageously be used in very high speed applications such as 10 Gbit receivers.

FIG. 5 is a simplified block diagram of one embodiment of a comparator 500 that may be used in the comparators 202A–C of FIG. 2. An input differential pair 502 and 504 generates a comparison signal through transistors 506 and 508. The comparison signal is then provided to gain stages 516, 518, 520 and 522. A current source for the input differential pair 502 and 504 is provided by transistors 510 and 512 and resistor 514. In practice, it is desirable to make the input differential pair as large as possible to reduce any adverse effects that may result from a mismatch between the transistors 502 and 504.

Figure 7:
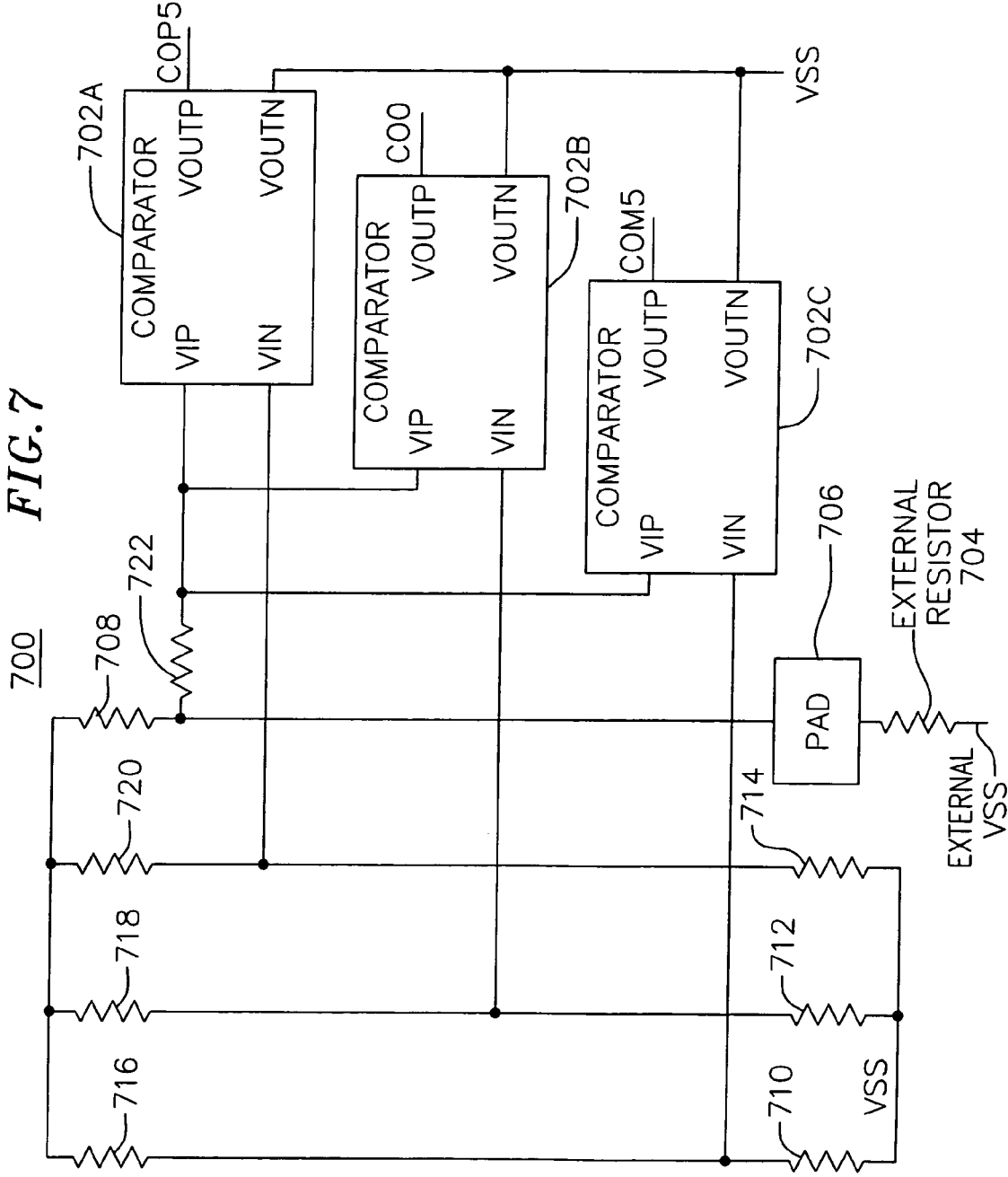
FIG. 7 is a simplified block diagram of one embodiment of a resistor compensation circuit constructed in accordance with the invention.

FIG. 7 is a simplified block diagram of one embodiment of another resistor compensation circuit 700 constructed in accordance with the invention. In FIG. 7 an external to internal resistor ratio is compared with various internal resistor ratios. By evaluating which comparator 702A–C has switched, internal resistance deviation may be calculated. With this information, a relatively simple resistor digital to analog converter as discussed above may be used to approximate a desired resistance value.

The embodiment of FIG. 7 is similar to the embodiment of FIG. 2 in that a series of comparators 702A–C compare a signal at the junction of an external resistor 704 and an internal resistor 708 with three separate reference signals. Here, resistor 722 may be inconsequential as it merely protects against electrostatic discharge pulses that may be received via pad 706.

In one embodiment, the resistors 704, 708, 710, 712 and 714 have the same nominal resistance values. The resistors 716, 718 and 720 have nominal resistance values that are approximately 5% less than, equal to, and 5% more than, respectively, the nominal value of the other resistors. Accordingly, the comparators 702A–C may generate signals COP5, CO0 and COM5 for controlling programmable resistors in a manner similar to the control signals discussed above.

In practice, since the embodiment of FIG. 7 includes three resistor legs instead of a resistor ladder this embodiment may consume more current and die area than the circuit of FIG. 2.

Figure 8:
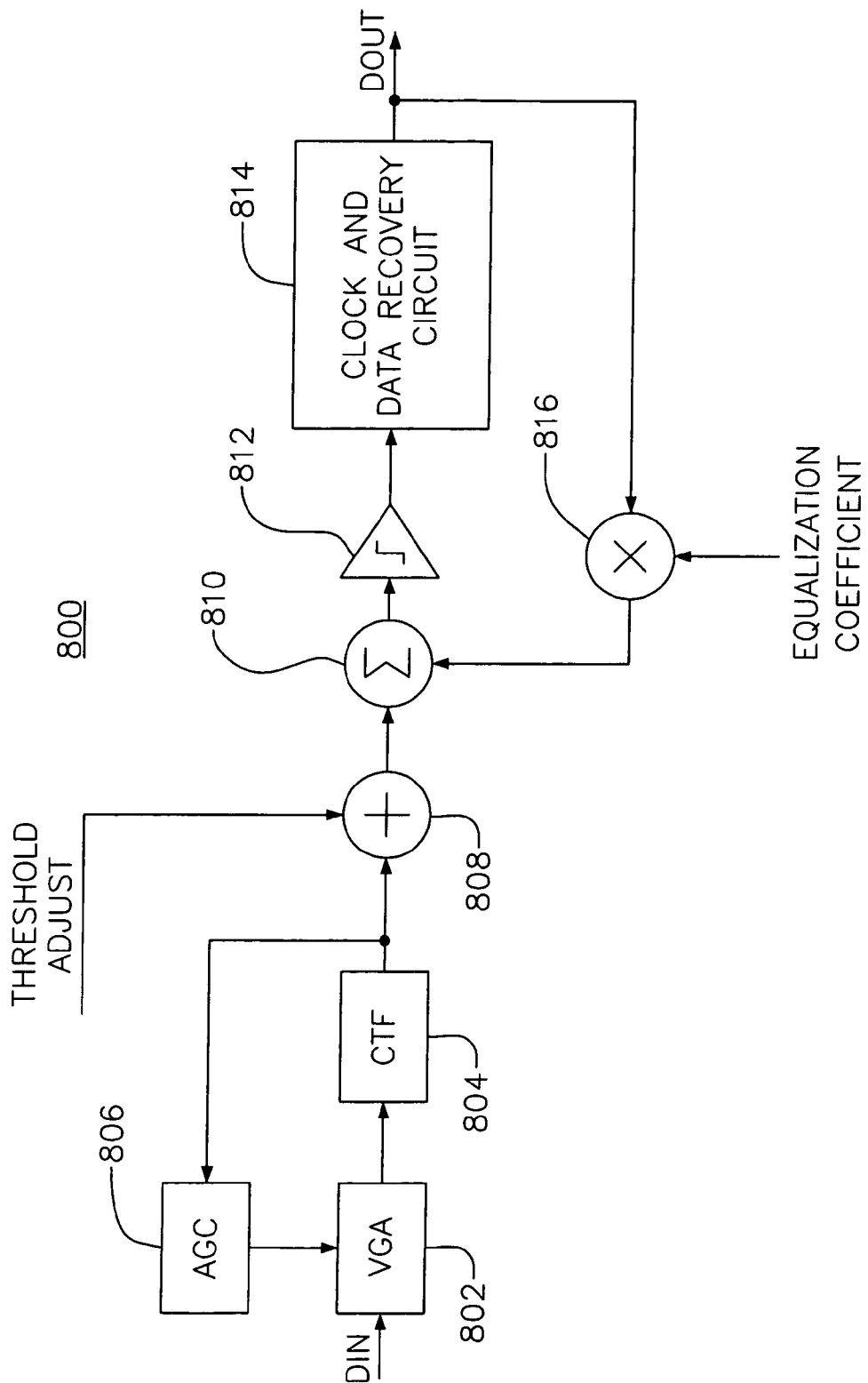
FIG. 8 is a simplified block diagram of one embodiment of a receiver constructed in accordance with the invention.

FIG. 8 is a simplified block diagram of a one embodiment of a receiver 800 that may utilize resistor compensation as treated herein. The receiver 800 includes a one tap decision feedback equalizer and other components that may incorporate current mode logic.

Variations in the actual resistance of resistors in a current mode logic buffer may be a primary contributor to the bandwidth and/or delay variation of the buffer. Accordingly, it is desirable to reduce resistor load variations in flip flops, latches or other current mode logic components. Reducing this variation may be particularly advantageous in very high speed circuits. For example, in the receiver 800 the decision feedback equalizer section is delay sensitive and the continuous time filter is bandwidth sensitive. Moreover, these components are in the high speed data path of the circuits.

As an example, in a 10 Gbit receiver the data input signal DIN is a 10 GHz signal. This signal is amplified by a variable gain amplifier 802 then filtered by a continuous time filter 804. The output of the continuous time filter 804 is fed back to an automatic gain control circuit 806 that controls the gain of the variable gain amplifier 802.

In some embodiments an adder 808 may be used to add a threshold adjustment signal to the output of the continuous time filter 804. In any event the amplified and filtered signal is provided to a summer 810.

The summer 810 combines this incoming data with a feedback signal from a multiplier 816. A slicer 812 converts the output of the summer (soft decision) to a binary signal. A clock and data recovery circuit 814 including one or more flip-flops and latches recovers the data DOUT from the binary signal in response to a recovered clock. The multiplier 816 multiples the recovered data DOUT by an equalization coefficient (typically a negative number) to generate a scaled feedback signal (typically a negative number) that is then combined with incoming data by the summer 810 as discussed above. The equalizer therefore serves to subtract a previous symbol from a current symbol to reduce or eliminate channel induced distortion such as inter-symbol interference.

To effectively subtract a previous symbol from a current symbol, the delay through the feed back path should be relatively precise so that the two symbols are appropriately aligned in time when they are added. Accordingly, resistor compensation as described herein may be effectively used in the logic circuits in this path to help ensure that the delay through the feedback path does not vary significantly from the desired delay.

Figure 9:
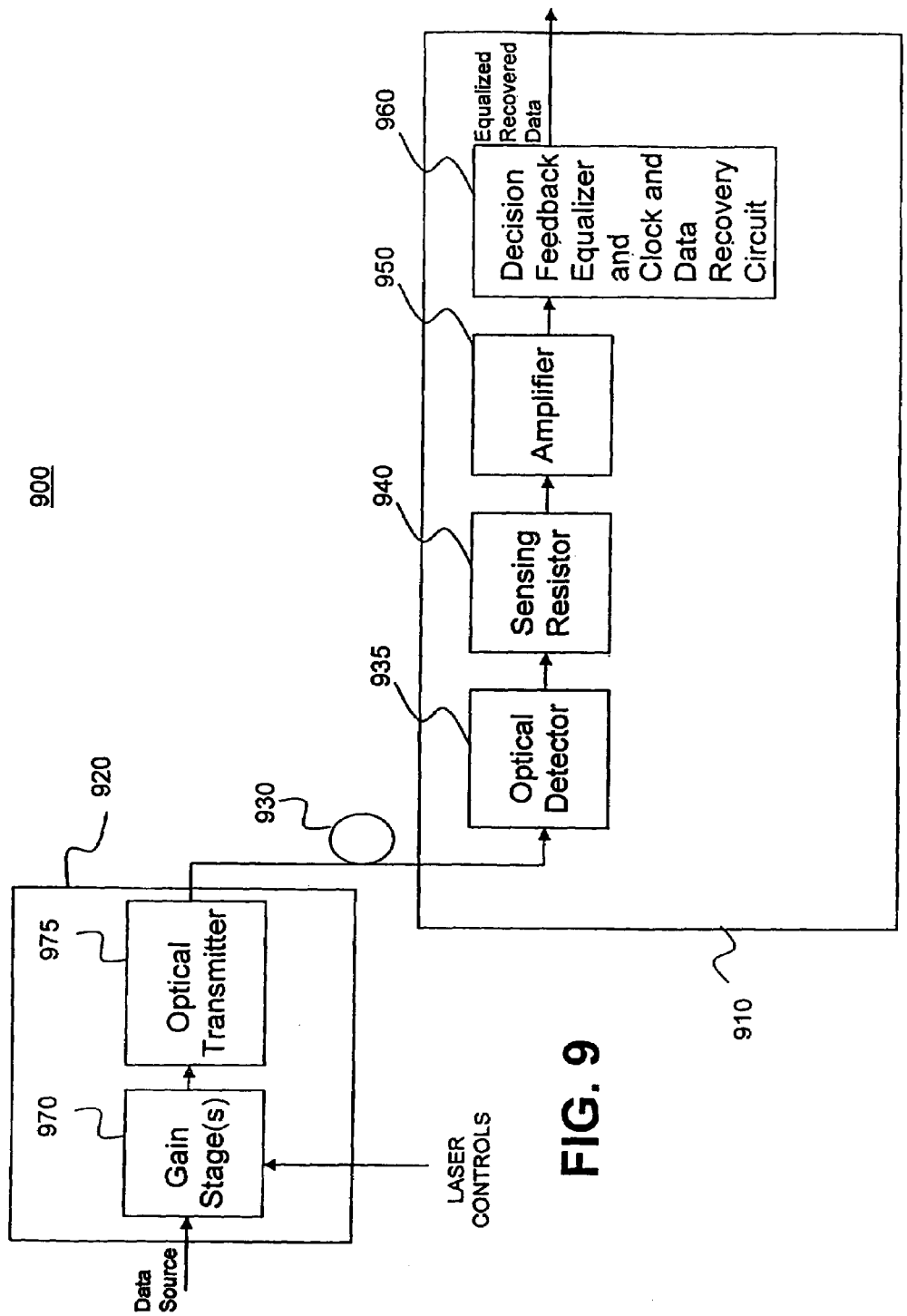
FIG. 9 is a simplified block diagram of one embodiment of an optical communications system constructed in accordance with the invention.

The resistor compensation circuit described herein may be integrated into any of a variety of applications. For example, referring to FIG. 9, the described exemplary resistor compensation circuit may be incorporated into an optical receiver assembly 910 of an optical communication system 900. The optical system 900 includes an optical transmitter 920 and an optical fiber network 930 that carries the optical signal to the optical receiver assembly 910. Those skilled in the art will appreciate that the teachings of the invention are not limited to a single optical transmitter and receiver or to optical receivers. For example, practical optical communications systems may have one or more optical transmitters as well as one or more optical receivers.

The illustrated receive path includes an optical detector 935, sensing resistor 940, one or more amplifier(s) 950, and an integrated decision feedback equalizer and clock and data recovery circuit 960. The optical detector 935 may comprise a known prior art optical detector implementation. Such prior art detectors convert incoming optical signals into corresponding electrical output signals that may be electronically monitored.

A transmit path includes, by way of example, one or more gain stage(s) 970 coupled to an optical transmitter 975. The gain stage(s) 970 may have multiple stages, and may receive one or more control signals for controlling various different parameters of the output of the optical transmitter. In one embodiment an analog data source provides an analog data signal that modulates the output of the optical transmitter. In other embodiments, baseband digital modulation or frequency modulation may be used.

In this embodiment, the gain stage(s) 970 amplify the incoming data signal from the data source according to laser control signals. The amplified data signal, in turn, drives the optical transmitter 975.

The optical transmitter may, for example, be a light emitting diode or a surface emitting laser or an edge emitting laser that operate at high speeds such as 10 Gigabits per second ("Gbps") or higher. The optical transmitter 975 thereby generates an optical data signal that is provided to a fiber optic cable 930.

The fiber optic cable 930 carries the optical data signal to the optical detector 935. In operation, when the transmit optical beam is incident on a light receiving surface area of the optical detector, electron-hole pairs are generated. A bias voltage applied across the optical detector 935 generates a flow of electric current having an intensity proportional to the intensity of the incident light. In one embodiment, this current flows through sensing resistor 940, and generates a voltage.

The sensed voltage is amplified by the one or more amplifier(s) 950 and the output of amplifier(s) 950 drives the integrated decision feedback equalizer and clock and data recovery circuit 960. As illustrated in FIG. 8, the decision feedback equalizer may include, by way of example, a slicer that generates a binary signal that drives a clock and data recovery circuit. The clock and data recovery circuit generates an extracted clock signal from the binary signal that is then used to retime the equalized data as discussed above. One example of an integrated decision feedback equalizer and clock and data recovery circuit is described in U.S. patent application Ser. No. 10/823,252, filed Apr. 10, 2004, the disclosure of which is hereby incorporated by reference herein.

A receiver constructed according to the invention may support various data protocols and date rates. For example, in one embodiment the receiver is a multi-rate SONET/SDH/10GE/FEC receiver that may operate at very high speeds including, for example, 9.953, 10.3125, 10.664 or 10.709 Gbps. This receiver includes, in a single chip solution, an optical equalizer and CDR as discussed above, a linear amplifier, deserializer and other components.

In one embodiment the receiver chip is implemented using CMOS technology. However, the teachings herein are applicable to other types of processes including for example, GaAs, Bi-MOS, Bipolar, etc.

Figure 10:
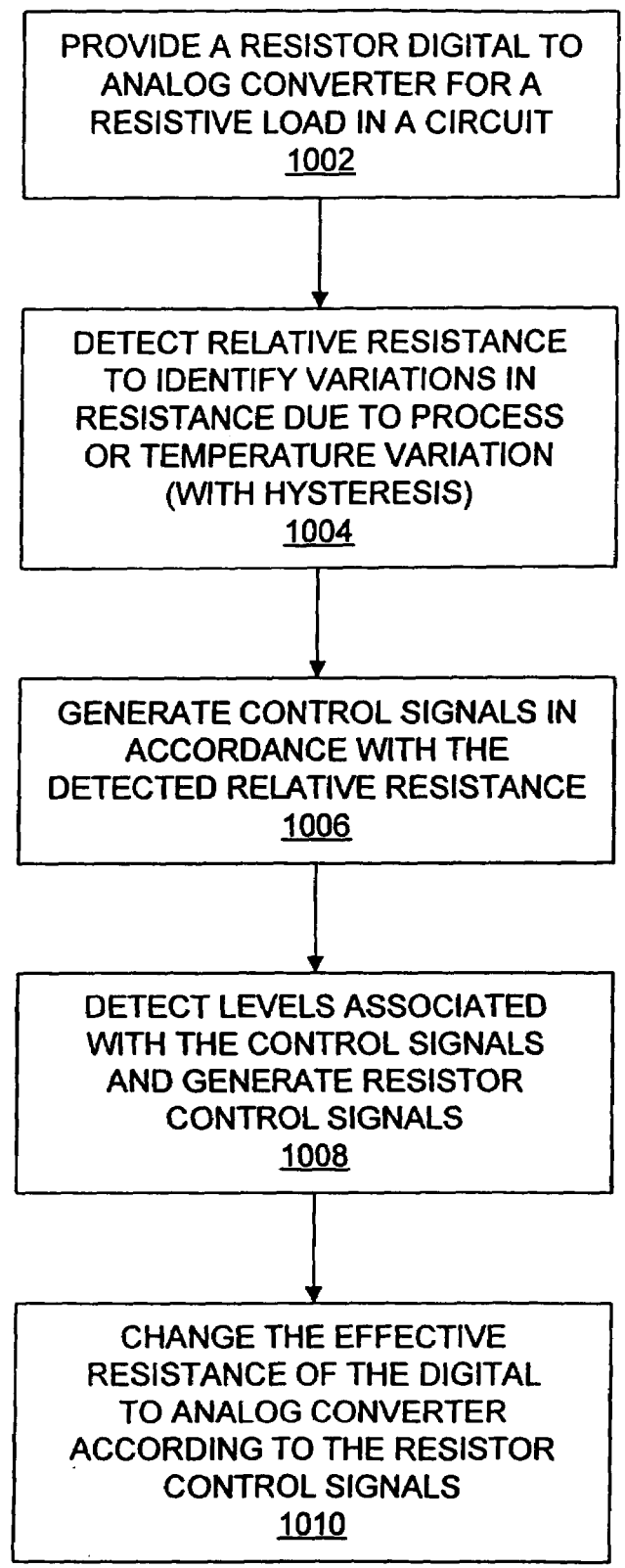
FIG. 10 is a flow chart of one embodiment of operations that may be performed to provide resistor compensation in accordance with the invention.

In summary, FIG. 10 is a flowchart that depicts several of the operations discussed herein. As represented by block 1002, a circuit is initially designed with resistive loads in critical data paths implemented as programmable resistors (e.g., resistor digital to analog converters and associated load resistors).

As represented by block 1004, comparators and associated hysteresis circuits detect the relative resistance between one or more internal resistor(s) and one or more external resistor(s). Here, the comparators detect any variation in the resistance of the internal resistors from their nominal values due to, for example, process or temperature variation, by comparing signals from a resistor network consisting of the internal and external resistor(s).

As represented by block 1006, the comparator generates control signals in accordance with the detected relative resistance and, in some embodiments, a level control circuit processes the control signal to detect levels associated with the control signals (block 1008). In this case, the level control circuit generates resistor control signals to control the programmable resistors in the circuit.

As represented by block 1010, the control signals are used to select the effective resistance of the programmable resistor. For example, the programmable resistor may comprise a resistor digital analog converter that selectively parallels resistors with a load resistor according to the control signals.

Different embodiments of the invention may include a variety of hardware components. In some embodiments of the invention, hardware components such as controllers, state machines and/or logic are used in a system constructed in accordance with the invention.

Such components may be implemented on one or more integrated circuits. For example, in some embodiments several of these components may be combined within a single integrated circuit. In some embodiments some of the components may be implemented as a single integrated circuit. In some embodiments some components may be implemented as several integrated circuits.

Moreover, the teachings herein are applicable to circuits other than integrated circuits. For example, a resistor compensation apparatus as described herein may be used in other circuits where it is desirable to provide compensation because resistance in the circuit may change due to changes in environmental conditions.

The components and functions described herein may be connected/coupled in many different ways. The manner in which this is done may depend, in part, on whether the components are separated from the other components. In some embodiments some of the connections represented by the lead lines in the drawings may be in an integrated circuit, on a circuit board and/or over a backplane to other circuit boards.

The signals discussed herein may take several forms. As used herein, a signal may comprise more than one signal. For example, a differential signal comprises two complementary signals or some other combination of signals. In addition, a group of signals may be collectively referred to as a signal herein.

The components and functions described herein may be connected/coupled directly or indirectly. Thus, in some embodiments there may or may not be intervening devices (e.g., buffers) between connected/coupled components.

In summary, the invention described herein generally relates to improved resistor compensation techniques. While certain exemplary embodiments have been described above in detail and shown in the accompanying drawings, it is to be understood that such embodiments are merely illustrative of and not restrictive of the broad invention. In particular, it should be recognized that the teachings of the invention apply to a wide variety of systems and processes. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. A resistor compensation circuit comprising:
   at least one reference resistor;
   at least one circuit resistor;
   a plurality of comparators for comparing resistances of the at least one reference resistor and the at least one circuit resistor to generate at least one control signal;
   a fixed load resistor; and
   at least one digital to analog converter, connected in parallel with the fixed load resistor, that provides a selectable resistance in accordance with the at least one control signal.

2. The resistor compensation circuit of claim 1 wherein the at least one digital to analog converter provides selectable resistance within discrete ranges of resistance.

3. The resistor compensation circuit of claim 1 wherein the at least one digital to analog converter comprises at least one series connected transistor and resistor, wherein the at least one series connected transistor and resistor is connected in parallel with the fixed load resistor.

4. The resistor compensation circuit of claim 1 comprising a current mode logic circuit that includes the at least one digital to analog converter.

5. The resistor compensation circuit of claim 1 wherein the comparators compares a plurality of reference signals with at least one signal associated with an external to internal resistor ratio.

6. The resistor compensation circuit of claim 5 comprising at least one hysteresis circuit adapted to provide the reference signals to the comparators.

7. The resistor compensation circuit of claim 1 wherein ranges of resistance are associated with values of the at least one control signal.

8. The resistor compensation circuit of claim 1 comprising at least one resistor ladder for generating reference signals to provide input signals for the comparators.

9. The resistor compensation circuit of claim 1 comprising at least one hysteresis circuit.

10. The resistor compensation circuit of claim 9 wherein the at least one hysteresis circuit selects reference signals to provide input signals for the comparators.

11. The resistor compensation circuit of claim 1 comprising at least one hysteresis switch.

12. The resistor compensation circuit of claim 1 comprising at least one resistor ladder for generating reference signals and at least one hysteresis circuit, wherein the at least one hysteresis circuit selects at least a portion of the reference signals to provide input signals for the comparators.

13. The resistor compensation circuit of claim 1 comprising at least one level decision circuit for detecting at least one signal level associated with the at least one control signal.

14. The resistor compensation circuit of claim 13 wherein the at least one level decision circuit comprises at least one counter.

15. The resistor compensation circuit of claim 1 comprising:
    at least one resistor ladder for generating reference signals; and
    at least one hysteresis circuit configured to select at least a portion of the reference signals to provide input signals for the comparators; and
    at least one level decision circuit for detecting a signal level associated with the at least one control signal.

16. The resistor compensation circuit of claim 15 wherein the at least one digital to analog converter comprises at least one transistor connected in series with at least one resistor connected in series, wherein the at least one transistor and at least one resistor are connected in parallel with at least one load resistor.

17. The resistor compensation circuit of claim 1 wherein the compared resistances are associated with a plurality of ranges of resistance and each range of resistance is associated with a unique value of the at least one control signal.

18. A method of compensating resistance comprising:
    providing at least one programmable resistor having a controllable resistance;
    detecting variation in a resistance due to process or temperature variation;

generating at least one control signal in accordance with the detected variation in the resistance; and controlling the resistance of the at least one programmable resistor in accordance with the at least one control signal;

wherein the at least one programmable resistor comprises a fixed load resistor connected in parallel with at least one digital to analog converter.

19. The method of claim 18 wherein the at least one digital to analog converter provides selectable resistance within discrete ranges of resistance.

20. The method of claim 18 wherein the at least one digital to analog converter comprises at least one series connected transistor and resistor, wherein the at least one series connected transistor and resistor is connected in parallel with the fixed load resistor.

21. The method of claim 18 comprising comparing a plurality of reference signals with at least one signal associated with an external to internal resistor ratio.

22. The method of claim 18 wherein detecting variation in a resistance comprises applying hysteresis to a reference signal.

23. A method of compensating resistance comprising:

providing at least one programmable resistor having a controllable resistance;

detecting variation in a resistance due to process or temperature variation;

generating at least one control signal in accordande with the detected variation in the resistance; controlling the resistance of the at least one programmable resistor in accordance with the at least one control signal; and comparing a plurality of reference signals with at least one signal associated with an external to internal resistor ratio.

24. A method of compensating resistance comprising:

providing at least one programmable resistor having a controllable resistance;

detecting variation in a resistance due to process or temperature variation;

generating at least one control signal in accordance with the detected variation in the resistance;

controlling the resistance of the at least one programmable resistor in accordance with the at least one control signal; and generating reference signals and selecting at least a portion of the reference signals for comparison with at least one signal associated with an external to internal resistor ratio.

25. A method of compensating resistance comprising:

providing at least one programmable resistor having a controllable resistance;

detecting variation in a resistance due to process or temperature variation;

generating at least one control signal in accordance with the detected variation in the resistance;

controlling the resistance of the at least one programmable resistor in accordance with the at least one control signal; and sampling the at least one control signal for at least one period of time to determine at least one signal level associated with the at least one control signal.

26. A method of compensating resistance comprising:

providing at least one programmable resistor having a controllable resistance;

detecting variation in a resistance due to process or temperature variation;

generating at least one control signal in accordance with the detected variation in the resistance; and controlling the resistance of the at least one programmable resistor in accordance with the at least one control signal;

wherein detecting variation in a resistance comprises applying hysteresis to a reference signal.

* * * * *